United States Patent
Lee et al.

(10) Patent No.: US 10,756,293 B2
(45) Date of Patent: Aug. 25, 2020

(54) ORGANIC LIGHT-EMITTING DISPLAY DEVICE HAVING AN UNDERCUT IN THE OPENING FOR THE ELECTRICAL CONNECTION TO AN AUXILIARY ELECTRODE

(71) Applicant: LG Display Co., Ltd., Seoul (KR)

(72) Inventors: Jae-Sung Lee, Seoul (KR); Jong-Hyeok Im, Busan (KR); Do-Hyung Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 130 days.

(21) Appl. No.: 15/826,577

(22) Filed: Nov. 29, 2017

(65) Prior Publication Data
US 2018/0151831 A1    May 31, 2018

(30) Foreign Application Priority Data
Nov. 30, 2016  (KR) .................. 10-2016-0162362

(51) Int. Cl.
*H01L 29/08*      (2006.01)
*H01L 35/24*      (2006.01)
(Continued)

(52) U.S. Cl.
CPC ...... *H01L 51/5228* (2013.01); *H01L 27/3223* (2013.01); *H01L 27/3258* (2013.01);
(Continued)

(58) Field of Classification Search
CPC ............ H01L 27/326; H01L 27/3279; H01L 51/5253; H01L 51/5228; H01L 51/5212; H01L 51/5209; H01L 51/5225
See application file for complete search history.

(56) References Cited

U.S. PATENT DOCUMENTS

2007/0024181 A1*  2/2007  Oh ............... H01L 27/3258
                                                    313/500
2009/0153046 A1*  6/2009  Hayashi ........ H01L 27/3276
                                                    313/505
(Continued)

FOREIGN PATENT DOCUMENTS

CN        1645979 A      7/2005
EP     3 026 724 A1      6/2016
KR    20100133725 A  *  12/2010

*Primary Examiner* — Ismail A Muse
(74) *Attorney, Agent, or Firm* — Seed IP Law Group LLP (57) ABSTRACT

Disclosed is an organic light-emitting display device configured such that the undercut shape of an auxiliary electrode is improved and such that a region where the auxiliary electrode and a second electrode contact is filled with an inorganic film, whereby a gap is prevented from being formed and the reliability of the organic light-emitting display device is improved. The organic light-emitting display device includes a first electrode located on a substrate defined by an active area and a non-active area, an organic layer including an emissive layer located on the first electrode, a second electrode located on the organic layer, an auxiliary electrode located in the non-active area, and a passivation layer located on the auxiliary electrode, the passivation layer having a reverse taper-shaped end so as to be exposed to the side surface of the auxiliary electrode. The second electrode extends to the non-active area so as to be electrically connected to the exposed auxiliary electrode. In addition, the auxiliary electrode has a taper-shaped end under the passivation layer.

14 Claims, 4 Drawing Sheets

(51) Int. Cl.
 *H01L 51/00* (2006.01)
 *H01L 51/52* (2006.01)
 *H01L 27/32* (2006.01)
 *H01L 51/50* (2006.01)
 *H01L 51/56* (2006.01)

(52) U.S. Cl.
 CPC ...... *H01L 27/3262* (2013.01); *H01L 27/3272* (2013.01); *H01L 27/3279* (2013.01); *H01L 51/5012* (2013.01); *H01L 51/5206* (2013.01); *H01L 51/5253* (2013.01); *H01L 51/56* (2013.01); *H01L 2227/323* (2013.01); *H01L 2251/301* (2013.01); *H01L 2251/308* (2013.01)

(56) References Cited

U.S. PATENT DOCUMENTS

| | | | |
|---|---|---|---|
| 2009/0298377 A1* | 12/2009 | Yamazaki | H01L 27/3246 445/52 |
| 2009/0309493 A1* | 12/2009 | Seo | H01L 27/3246 313/506 |
| 2010/0051958 A1* | 3/2010 | Izumida | H01L 51/5234 257/72 |
| 2010/0244664 A1* | 9/2010 | Fujioka | H01L 51/5212 313/504 |
| 2013/0256638 A1* | 10/2013 | Uesugi | H01L 51/5228 257/40 |
| 2014/0183501 A1* | 7/2014 | Kim | H01L 27/3246 257/40 |
| 2015/0179719 A1 | 6/2015 | Nam et al. | |
| 2015/0221708 A1* | 8/2015 | Go | H01L 51/5246 257/40 |
| 2016/0013438 A1* | 1/2016 | Im | H01L 51/5228 257/40 |
| 2016/0149155 A1* | 5/2016 | Kim | H01L 27/3276 257/40 |
| 2016/0293888 A1 | 10/2016 | Shim et al. | |

* cited by examiner

FIG.3A
The Related Art

ORGANIC LIGHT-EMITTING DISPLAY DEVICE HAVING AN UNDERCUT IN THE OPENING FOR THE ELECTRICAL CONNECTION TO AN AUXILIARY ELECTRODE

This application claims the benefit of Korean Patent Application No. 10-2016-0162362, filed on Nov. 30, 2016, which is hereby incorporated by reference as if fully set forth herein.

BACKGROUND

Technical Field

The present disclosure relates to an organic light-emitting display device, and more particularly to an organic light-emitting display device that is capable of achieving contact with an auxiliary electrode using an undercut structure, whereby the reliability of the organic light-emitting display device is improved.

Description of the Related Art

Image display devices, which are a core technology in the information and communication age and serve to display various kinds of information on a screen, have been developed such that the image display devices are thinner, lighter, and portable and exhibit high performance. In addition, organic light-emitting display devices, which control the amount of light that is emitted from an organic light-emitting layer to display an image, have been highlighted as flat panel display devices that have lower weight and volume than cathode ray tubes (CRT).

In an organic light-emitting display device, a plurality of pixels is arranged in the form of a matrix to display images. Each pixel includes a light-emitting device, and the organic light-emitting display device includes a pixel-driving circuit including a plurality of transistors configured to independently drive the respective light-emitting devices and storage capacitors. Each light-emitting device includes an emissive layer disposed between a first electrode and a second electrode.

In recent years, research has been actively conducted into top-emission type organic light-emitting display devices that have an increased aperture ratio and are capable of realizing a transparent display. In top-emission type organic light-emitting display devices, light must be transmitted through an upper electrode, i.e., a second electrode, in order to display images. Consequently, the second electrode is made of a transparent conductive material. Since the transparent conductive material exhibits higher resistance than a pure, opaque metal, an auxiliary electrode is used in the non-active area to reduce the resistance thereof.

In an auxiliary electrode of the related art, contact between the auxiliary electrode and the second electrode is achieved using a reverse taper-shaped partition wall. However, there is a high demand to develop substitutive structures that do not use a partition wall material in order to reduce the number of of a masks and associated material costs.

As one such substitutive structure, there has been proposed a structure in which a passivation layer is provided on an auxiliary electrode, the lower part of the passivation layer has an undercut shape formed by etching, the side surface of the auxiliary electrode is exposed at the etched lower part of the passivation layer, and a second electrode contacts the exposed side surface of the auxiliary electrode.

In an organic light-emitting display device having such an undercut-shaped passivation layer, when an inorganic film is formed after an organic layer including an emissive layer has been formed, the inorganic film cannot fill the undercut-shaped lower part of the passivation layer, with the result that a gap is formed. External impurities, such as moisture, oxygen, or hydrogen, permeate into the organic light-emitting display device through the gap. The impurities damage the organic layer, with the result that the organic layer may be stained. In addition, the mechanical properties of the organic light-emitting display device may be deteriorated, whereby the reliability of the organic light-emitting display device may be reduced.

BRIEF SUMMARY

Accordingly, the present disclosure is directed to an organic light-emitting display device that substantially obviates one or more problems due to limitations and disadvantages of the related art.

One of the objects of the present disclosure is to provide an organic light-emitting display device configured such that the undercut shape of an auxiliary electrode is improved and such that a region where the auxiliary electrode and a second electrode contact is filled with an inorganic film, whereby a gap is prevented from being formed and the reliability of the organic light-emitting display device is improved.

Additional advantages, objects, and features of the disclosure will be set forth in part in the description which follows and in part will become apparent to those having ordinary skill in the art upon examination of the following, or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an organic light-emitting display device includes a first electrode located on a substrate. The substrate has an active area and a non-active area. An organic layer including an emissive layer is located on the first electrode, a second electrode is located on the organic layer including the emissive layer, and an auxiliary electrode is located in the non-active area. A passivation layer is located on the auxiliary electrode. The passivation layer having a reverse taper-shaped end. A side surface of the auxiliary electrode is exposed below the passivation layer.

In one embodiment, the reverse taper-shaped end of the passivation layer overlies the exposed side surface of the auxiliary electrode. In this embodiment, the reverse taper-shaped end provides for easy exposure of the side surface of the auxiliary electrode. In one embodiment, the side surface of the auxiliary electrode has a positive taper, but this is not required in all embodiments.

The second electrode extends to the non-active area so as to be electrically connected to the exposed auxiliary electrode. In addition, the auxiliary electrode has a taper-shaped end under the passivation layer.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings. Wherever possible, the same reference numbers will be used throughout the drawings to refer to the same or like parts. In the following description of the present disclosure, a detailed description of known functions and configurations incorporated herein will be omitted when it may obscure the subject matter of the present disclosure. In addition, the terms used in the following description are selected in consideration of ease of preparation of the specification, and may be different from the names of parts constituting an actual product.

It will be understood that when an element is referred to as being "on," "above," "under" or "beside" another element, one or more intervening elements may be present therebetween, as long as the term "immediately" or "directly" is not used.

It may be understood that, although the terms "first," "second," etc., may be used herein to describe various elements, these elements are not to be limited by these terms. These terms are generally only used to distinguish one element from another. In the following description, therefore, an element identified by "first" may be an element identified by "second" without falling outside the technical concept of the present disclosure.

The size and thickness of each element shown in the drawings are given merely for the convenience of description, and the present disclosure is not limited thereto.

Hereinafter, various embodiments of the present disclosure will be described in detail with reference to the accompanying drawings.

Figure 1:
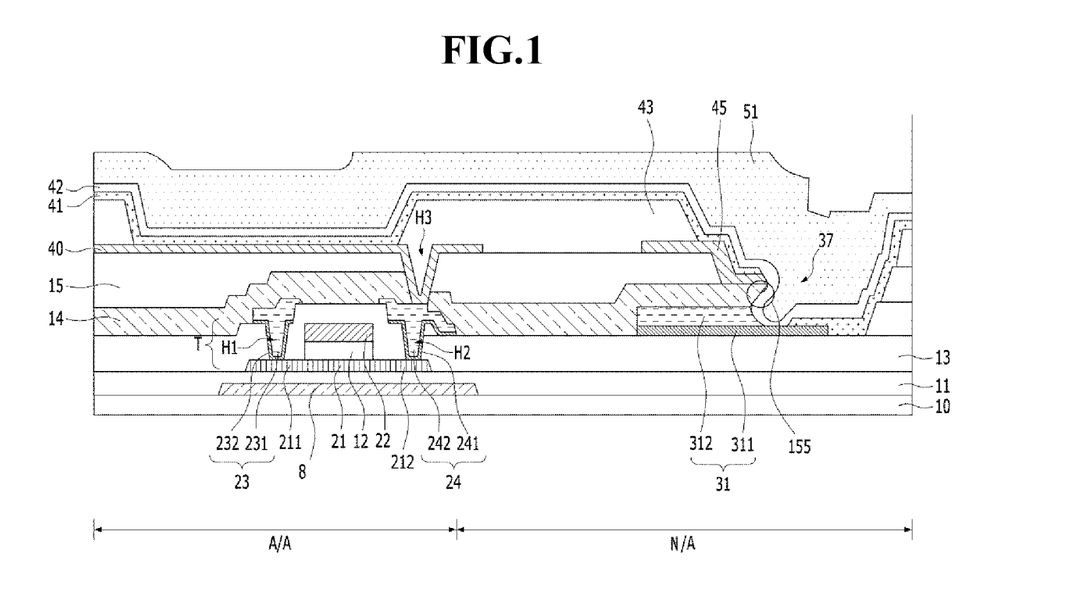
FIG. 1 is a schematic view illustrating an organic light-emitting display device according to an embodiment of the present disclosure.

FIG. 1 is a sectional view illustrating an organic light-emitting display device according to an embodiment of the present disclosure.

A substrate 10 includes an active area A/A and a non-active area N/A. A buffer layer 11 is formed on the substrate 10. The buffer layer 11 serves to prevent moisture or impurities from permeating through the substrate 10 and to planarize the upper part of the substrate 10. The buffer layer 11 may be made of an inorganic insulation material, such as SiNx or SiOx. A thin film transistor T and an organic light-emitting device are provided on the buffer layer 11.

A further detailed description will be given with reference to FIG. 1. An active layer 21 made of a semiconductor, such as a silicon or oxide semiconductor, is formed on the buffer layer 11.

A gate insulation film 12 is located on the active layer 21, and a gate electrode 22 is located on the gate insulation film 12. The gate electrode 22 may be made of a conductive material, such as molybdenum (Mo), tungsten (W), or Al/Cu. However, the disclosure is not limited thereto.

The active layer 21 may be made of silicon, amorphous silicon, poly-silicon, or low temperature poly-silicon (LTPS). A region of the active layer 21 where the gate electrode 22 is not formed may be doped with an N-type dopant or a P-type dopant so as to be made conductive.

In addition, the active layer 21 may be made of an oxide semiconductor. An indium gallium zinc oxide (InGaZnO), an indium tin zinc oxide (InSnZnO), an indium zinc oxide (InZnO), or a tin zinc oxide (SnZnO) may be used as the oxide semiconductor. The active layer 21 may be made conductive through plasma processing using the gate electrode 22 and a gate line GL as a mask.

An interlayer insulation film 13 is located on the gate electrode 22 and the active layer 21. The interlayer insulation film 13 is provided with a plurality of contact holes H1 and H2, through which a source region 211 and a drain region 212, which are formed as the active layer 21 is made conductive, are exposed. A source electrode 23 and a drain electrode 24 are formed through the contact holes H1 and H2. The source electrode 23 may have a two-layer structure including a first layer 231 and a second layer 232. The drain electrode 24 may also have a two-layer structure including a first layer 241 and a second layer 242. Alternatively, each of the source electrode 23 and the drain electrode 24 may be configured to have a three-layer structure including first to third layers.

The positions of the source electrode 23 and the drain electrode 24 may be changed depending on whether the thin film transistor is an n-type transistor or a p-type transistor.

The first layers 231 and 241 and the third layers (not shown) of the source electrode 23 and the drain electrode 24 may be made of a transparent conductive material, such as a molybdenum-titanium alloy (MoTi), ITO, IGZO, IZO, or ZnO. In addition, the second layers 232 and 242 of the source electrode 23 and the drain electrode 24 may be made of a low-resistance material, such as copper (Cu). Metal, such as MoTi or ITO, prevents a material, such as copper (Cu), constituting the second layers 232 and 242 of the source and drain electrodes 23 and 24 from being oxidized or deformed by the external environment.

A shading layer 8 may be further provided between the substrate 10 and the buffer layer 11. The shading layer 8 may serve to block light incident on the active layer 21 and to reduce parasitic capacitance generated between the thin film transistor T and various wires (not shown). The shading layer 8 may be made of any one selected from among silver (Ag), nickel (Ni), gold (Au), platinum (Pt), aluminum (Al), copper (Cu), molybdenum (Mo), titanium (Ti), and neodymium (Nd) or an alloy thereof.

The interlayer insulation film 13 is provided on the entire surface of the substrate 10 including the non-active area.

An auxiliary electrode 31 is formed on the interlayer insulation film 13 in the non-active area N/A. In one embodiment, this auxiliary layer 31 is formed at the same time and using the same layer as the source and drain electrodes 23 and 24. In other embodiments, the auxiliary electrode might be formed of a different conductive layer.

In a top-emission type organic light-emitting display device, an electrode located on the organic light-emitting device is generally a cathode, which is made of a transparent conductive material exhibiting high resistance or a low-resistance material that is sufficiently thin to transmit light. As a result, the resistance of the cathode located on the organic light-emitting device of the top-emission type organic light-emitting display device is not sufficiently low, whereby the low-potential voltage applied to the organic light-emitting device is increased. The auxiliary electrode 31 is made of a low-resistance material, and is connected to the electrode located on the organic light-emitting device to reduce the resistance of the electrode located on the organic light-emitting device.

Like the source and drain electrodes 23 and 24, the auxiliary electrode 31 has a plurality of layers. In particular, a first layer 311 of the auxiliary electrode 31 is formed so as to be longer than a second layer 312 of the auxiliary electrode 31. The second layer 312 of the auxiliary electrode 31 is tapered so as to more smoothly contact the electrode located on the organic light-emitting device.

The first layer 311 of the auxiliary electrode 31 is made of the same material as the first layers 231 and 241 of the source and drain electrodes 23 and 24, and in one embodiment, is formed simultaneously with the first layers 231 and 241 of the source and drain electrodes 23 and 24. The second layer 312 of the auxiliary electrode 31 is made of the same material as the second layers 232 and 242 of the source and drain electrodes 23 and 24, and is formed simultaneously with the second layers 232 and 242 of the source and drain electrodes 23 and 24 in one embodiment.

Meanwhile, like the source and drain electrodes 23 and 24, the auxiliary electrode 31 may be formed so as to have three layers. In this case, second and third layers of the auxiliary electrode 31 may be made of a transparent conductive material, such as a molybdenum-titanium alloy (MoTi), ITO, IGZO, IZO, or ZnO. A second layer of the auxiliary electrode 31 may be made of a low-resistance material, such as copper (Cu), like the source and drain electrodes 23 and 24.

Figure 2:
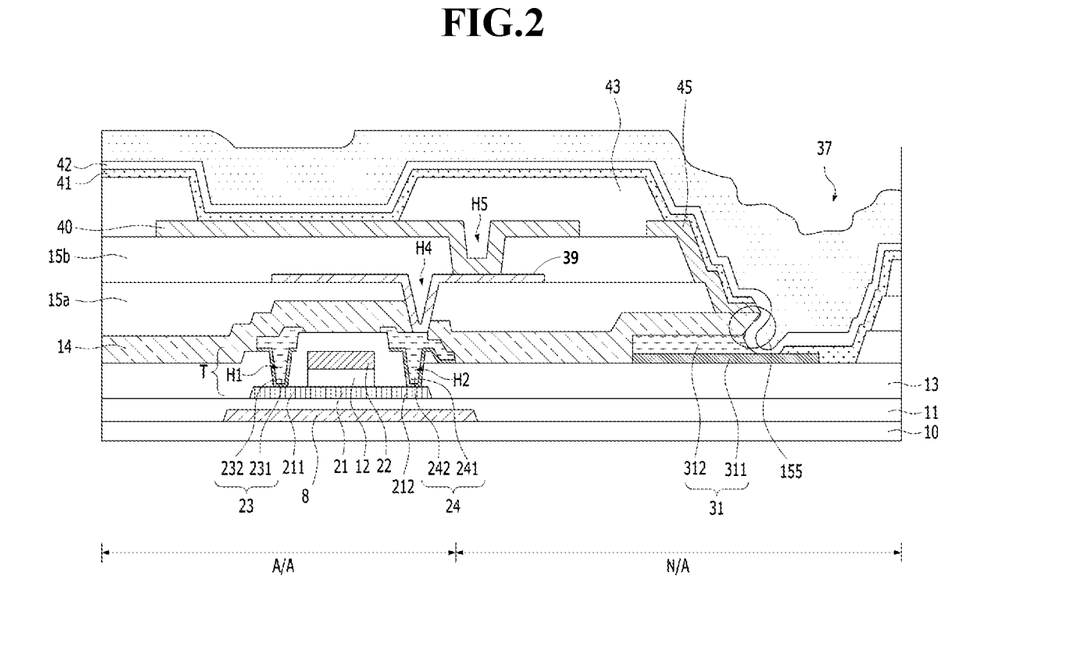
FIG. 2 is a schematic view illustrating an organic light-emitting display device according to another embodiment of the present disclosure.

A passivation layer 14 is formed on the thin film transistor T and the auxiliary electrode 31. The passivation layer 14 may have a single-layer or multi-layer structure made of at least one inorganic material selected from between SiNx and SiOx. The passivation layer 14 has an end 155 on the auxiliary electrode 31. The passivation layer 14 is located so as to cover the upper part of the auxiliary electrode 31, and the end 155 of the passivation layer 14 has a reverse taper shape, as shown in FIG. 1 and FIG. 2. Since the end 155 of the passivation layer 14 is provided on the auxiliary electrode 31, the passivation layer 14 is not formed at the side surface of the auxiliary electrode 31, and thus the side surface of the second layer 312 of the auxiliary electrode 31 is exposed.

Since the side surface of the auxiliary electrode 31 is tapered in the positive direction, but the passivation layer 14 has the reverse taper-shaped end 155 on the auxiliary electrode 31, the taper shapes thereof have different directions. That is, the end at the interface between the passivation layer 14 and the auxiliary electrode 31 is recessed further inward than both the upper or lower side thereof.

A planarization film 15 is located on the passivation layer 14. The planarization film 15 serves to remove the step at a region where the light-emitting device is located. The planarization film 15 may be made of at least one selected from among polyimide, photoacryl, and benzocyclobutene (BCB), all of which are organic insulation materials. The planarization film 15 may have a single-layer or multi-layer structure.

The planarization film 15 includes an organic hole 37 formed by removing a portion of the planarization film 15 to expose the end of the passivation layer 14 and the auxiliary electrode 31.

The planarization film 15 and the passivation layer 14 are provided with a contact hole H3, through which the drain electrode 24 is exposed. In the case in which the positions of the source electrode 23 and the drain electrode 24 are changed, the contact hole H3 may be formed so as to expose the source electrode 23.

In addition, a first electrode 40 is located on the planarization film 15. The first electrode 40 is connected to the source electrode 23 or the drain electrode 24 via the contact hole H3.

A dummy electrode 45 made of the same material as the first electrode 40 may be further formed on the same layer as the first electrode 40, particularly on the end of the planarization film 15. The dummy electrode 45 may serve as a barrier for preventing impurities from affecting an organic layer 41 of an organic light-emitting element due to outgassing through the planarization film 15.

The first electrode 40 and the dummy electrode 45 may have a single-layer or multi-layer structure made of a metal material or a transparent conductive material. Particularly, in a top-emission type organic light-emitting display device, the first electrode 40 may be made of a metal material exhibiting high reflectance, such as silver (Ag), so as to serve as a reflection plate for reflecting light that is emitted downward such that the light is directed upward. In the case in which the first electrode 40 serves as a reflection plate, the lifespan and efficiency of the organic light-emitting element are improved. In addition, since a material, such as silver (Ag), is oxidized by the external environment, the upper layer and the lower layer of the first electrode 40 may be made of a transparent conductive material, such as ITO, IZO, IGZO, or ZnO. That is, the first electrode 40 may be formed so as to have a three-layer structure including a lower layer made of a transparent conductive material, a middle layer made of a metal material exhibiting high reflectance, such as silver (Ag), and an upper layer made of a transparent conductive material.

A bank insulation film 43 may be provided so as to cove a portion of the first electrode 40 and define a pixel region. The bank insulation film 43 may include polyimide or acryl.

The organic layer 41 of the organic light-emitting element including an emissive layer is provided on the bank insulation film 43 and the first electrode 40. The organic layer 41 may be formed so as to include a hole injection layer (HIL), a hole transport layer (HTL), an emissive layer (EML), an electron transport layer (ETL), and an electron injection layer (EIL).

The organic layer 41 may be formed on the entirety of one surface of the substrate 10. The organic layer 41 has a discontinuous point D on the passivation layer 14 due to the reverse taper-shaped end of the passivation layer 14. That is, the organic layer 41 is not formed at a portion of the first layer 311 of the auxiliary electrode 31 and the side surface of the first layer 312 thereof.

A second electrode 42 is formed on the organic layer 41. The second electrode 42 is formed on the entirety of one surface of the substrate 10. The second electrode 42 may be made of a transparent conductive material, such as ITO, IZO, IGZO, or ZnO. Alternatively, the second electrode 42 may be made of any one selected from among silver (Ag), titanium (Ti), aluminum (Al), and molybdenum (Mo) or an alloy thereof.

In order to realize a top-emission type organic light-emitting display device, the second electrode 42 may be made of a transparent conductive material so as to transmit light from the organic layer 41. Alternatively, the second electrode 42 may be made of an opaque metal material having a sufficiently small thickness to transmit light, that is, 10 Å to 1000 Å. The first electrode 40 may be an anode, and the second electrode 42 may be a cathode.

The second electrode 42 extends to the upper part of the organic hole 37 so as to contact the auxiliary electrode 31, which has low resistance. The second electrode 42 is connected to the first layer 311 of the auxiliary electrode 31 at the discontinuous point D of the organic layer 41. Alternatively, the second electrode 42 is connected to the first layer 311 of the auxiliary electrode 31, and is also connected to a portion or the entirety of the side surface of the second layer 312 of the auxiliary electrode 31. Since the second electrode 42 is made of a transparent conductive material or an opaque metal material that is sufficiently thin to transmit light, as described above, the second electrode 42 does not have sufficiently low resistance to serve as a cathode. However, the auxiliary electrode 31 is formed so as to include a low-resistance metal material. When the auxiliary electrode 31 is connected to the second electrode 42, the resistance of the second electrode 42 is reduced. The second electrode 42, which serves as a cathode, may supply low-potential voltage VSS to the organic light-emitting element. If the resistance of the second electrode 42 is high, low-potential voltage VSS may rise. However, the resistance of the second electrode 42 is reduced due to contact between the auxiliary electrode 31 and the second electrode 42, thereby preventing a rise in the low-potential voltage VSS that is supplied to the organic light-emitting element.

A sealing layer 51 is formed on the entire surface of the substrate 10 including the second electrode 42. The sealing layer 51 may have a single-layer structure made of an inorganic insulation material, such as SiOx or SiNx. Alternatively, the sealing layer 51 may have a multi-layer structure in which different inorganic insulation films are alternately stacked. The sealing layer 51 prevents external air containing moisture and oxygen from permeating into the organic layer 41, thereby protecting the organic layer 41 including the emissive layer.

FIG. 2 is a schematic view illustrating an organic light-emitting display device including a middle electrode according to another embodiment of the present disclosure. The organic light-emitting display device shown in FIG. 2 is identical to the organic light-emitting display device shown in FIG. 1 with respect to the construction of a thin film transistor T, an auxiliary electrode 31, and a passivation layer 14.

In the organic light-emitting display device shown in FIG. 2, a planarization film 15 is formed so as to have two layers, between which a connection electrode 39 is located. A first planarization film 15a is located on the passivation layer 14, the connection electrode 39, which is connected to a source electrode 23 or a drain electrode 24 via a contact hole H4, is located on the first planarization film 15a. A second planarization film 15b is located on the connection electrode 39. A first electrode 40, which is connected to the connection electrode 39 via a contact hole H5, is located on the second planarization film 15b. A dummy electrode 45 is formed so as to cover side ends of the first planarization film 15a and the second planarization film 15b.

A bank insulation film 43, an organic layer 41 including an emissive layer, a second electrode 42, and a sealing layer 51 are identical in construction to those of the organic light-emitting display device shown in FIG. 1. The second electrode 42 is connected to a first layer 311 of the auxiliary electrode 31 through an organic hole 37 formed by removing a portion of the first planarization film 15a and the second planarization film 15b to expose the auxiliary electrode 31. Alternatively, the second electrode 42 is connected to the first layer 311 of the auxiliary electrode 31, and is also connected to a portion or the entirety of the side surface of a second layer 312 of the auxiliary electrode 31.

Figure 3A:
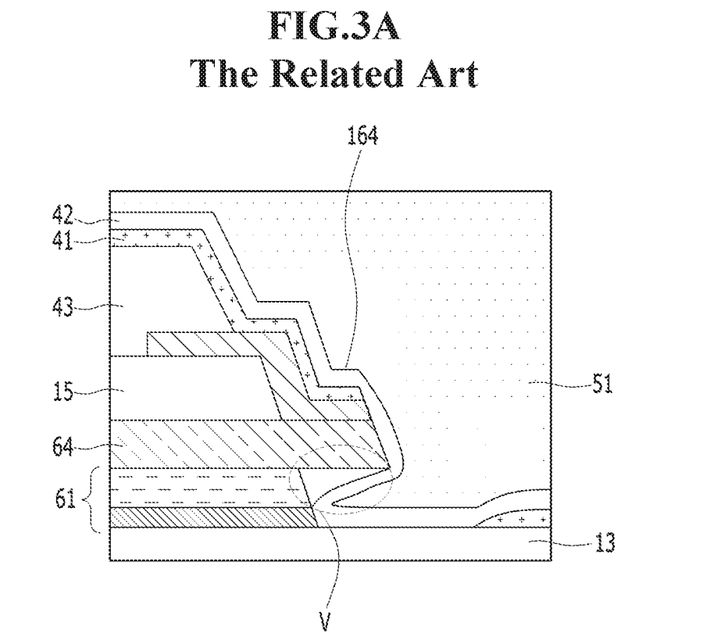
FIG. 3A is a schematic view illustrating a phenomenon in which a gap is formed when an auxiliary electrode is formed under a conventional undercut-shaped passivation layer.
Figure 3B:
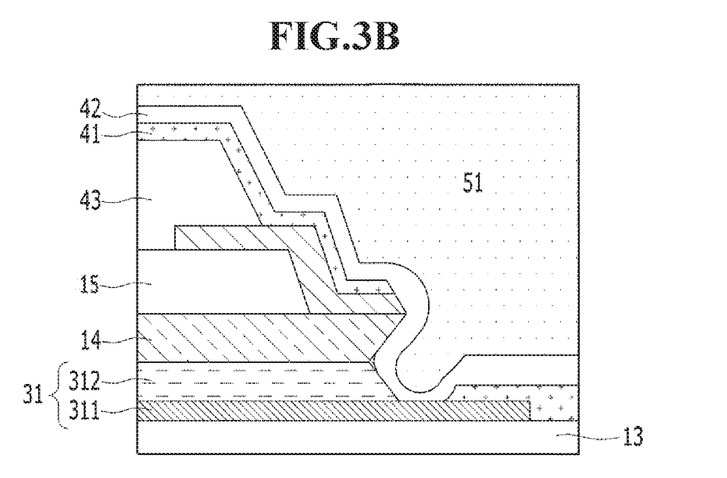
FIG. 3B is a schematic view illustrating the effect of preventing a gap from being formed when an auxiliary electrode is provided under a reverse taper-shaped passivation layer according to the present disclosure.

FIG. 3A is a schematic view illustrating a phenomenon in which a gap is formed when an auxiliary electrode is formed under a undercut-shaped passivation layer of the related art, and FIG. 3B is a schematic view illustrating the effect of preventing a gap from being formed when an auxiliary electrode is provided under a reverse taper-shaped passivation layer according to the present disclosure.

As shown in FIG. 3A, in an organic light-emitting display device configured such that an auxiliary electrode 61 is located under the end 164 of a undercut-shaped passivation layer 64 of the related art and such that the auxiliary electrode 61 is connected to a second electrode 42 under the passivation layer 64, a sealing layer 51 cannot fill the space under the passivation layer 64, with the result that a gap V is formed. Moisture or gas permeates into the organic light-emitting display device through the gap V, whereby an organic light-emitting element may be stained. In addition, if the gap V is formed, the mechanical properties of the organic light-emitting display device may be deteriorated.

On the other hand, as shown in FIG. 3B, the organic light-emitting display device according to the present disclosure is characterized in that the auxiliary electrode 31 is located under the end of the passivation layer 14 and is connected to the second electrode. In the organic light-emitting display device according to the present disclosure including the reverse taper-shaped passivation layer 14, the sealing layer 51 can fill the space under the passivation layer 14, with the result that no gap is formed. Consequently, the light-emitting display device is prevented from becoming defective, and the mechanical properties of the organic light-emitting display device are also improved.

Hereinafter, a method of manufacturing the organic light-emitting display device according to the present disclosure will be described with reference to FIGS. 4A to 4D. The method of manufacturing the organic light-emitting display device shown in FIG. 1 and the method of manufacturing the organic light-emitting display device shown in FIG. 2 are almost identical to each other. Consequently, the method of manufacturing the organic light-emitting display device shown in FIG. 1 will be described by way of example.

Figure 4A:
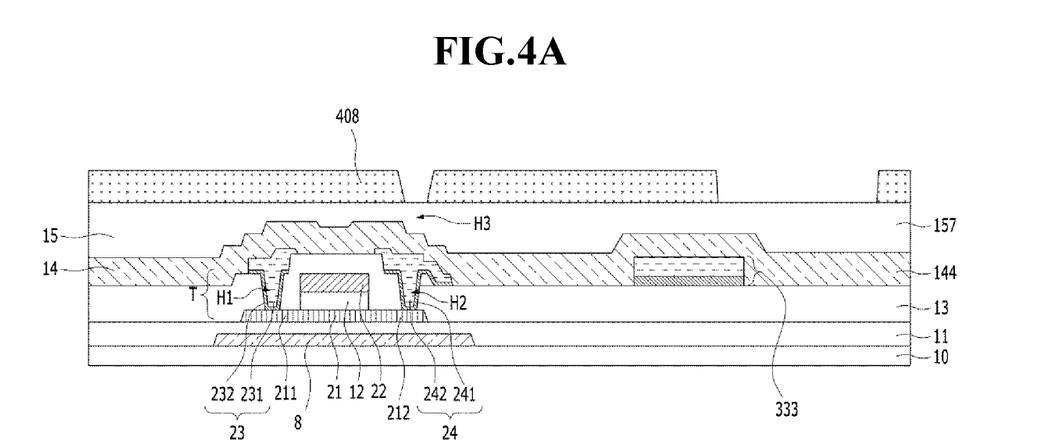
FIGS. 4A to 4D are views illustrating a method of manufacturing the organic light-emitting display device according to the present disclosure.

First, a manufacturing method from a thin film transistor T to an auxiliary electrode metal layer 333 shown in FIG. 4A will be described.

First, a shading layer 8 is formed on a substrate 10. The shading layer 8 may be formed by depositing and patterning any one selected from among silver (Ag), nickel (Ni), gold (Au), platinum (Pt), aluminum (Al), copper (Cu), molybdenum (Mo), titanium (Ti), and neodymium (Nd) or an alloy thereof.

Subsequently, a buffer layer 11 is formed on the entire surface of the substrate 10 including the shading layer 8. The buffer layer 11 may be formed by depositing an inorganic insulation material, such as SiNx or SiOx.

Subsequently, a thin film transistor T is formed on the buffer layer 11. More specifically, an active layer 21 may be formed, and then an inorganic insulation film and a metal layer may be deposited and patterned to form a gate insulation film 12 and a gate electrode 22. The gate insulation film 12 and the gate electrode 22 may be simultaneously patterned. Alternatively, the gate insulation film 12 and the gate electrode 22 may be separately formed through different patterning processing steps.

Subsequently, the active layer 21 is doped with a dopant using the gate electrode 22 as a mask to form a source region 211 and a drain region 212. In the case in which the active layer 21 is made of an oxide semiconductor, the active layer 21 may be made conductive through plasma processing.

Subsequently, an interlayer insulation film 13 is formed on the substrate 10 including the gate electrode 22. The interlayer insulation film 13 includes contact holes H1 and H2, through which the source region 211 and the drain region 212 are exposed. The interlayer insulation film 13 may be made of an inorganic insulation material, like the buffer layer 11.

Subsequently, a source electrode 23 and a drain electrode 24 are formed so as to be connected to the source region 211 and the drain region 212 via the contact holes H1 and H2, respectively, and an auxiliary electrode metal layer 333, from which an auxiliary electrode will be formed, is formed. The source electrode 23, the drain electrode 24, and the auxiliary electrode metal layer 333 may be formed by depositing a transparent conductive material, such as a molybdenum-titanium alloy (MoTi), ITO, IGZO, IZO, or ZnO, and a low-resistance material, such as copper (Cu), to form metal layers and simultaneously patterning the metal layers.

Figure 4B:
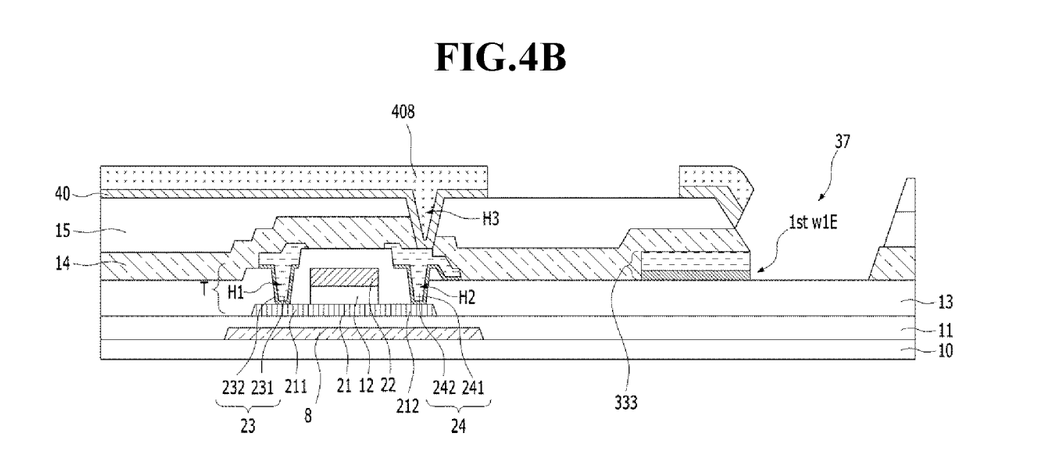

Subsequently, as shown in FIG. 4B, an inorganic film layer 144 for forming a passivation layer and an organic film layer 157 for forming a planarization film are formed on the auxiliary electrode metal layer 333 and the thin film transistor T. A photoresist 408 is applied to the organic film layer 157, the portion of the photoresist above the drain electrode 24 and the portion of the photoresist where an organic hole 37 will be formed are removed using a mask, and a passivation layer 14 and a planarization film 15 are formed by etching. At this time, a portion of the passivation layer 14 and the planarization film 15 is etched to form a contact hole H3, through which the drain electrode 24 is exposed, and an organic hole 37, through which the auxiliary electrode metal layer 333 is exposed.

Figure 4C:
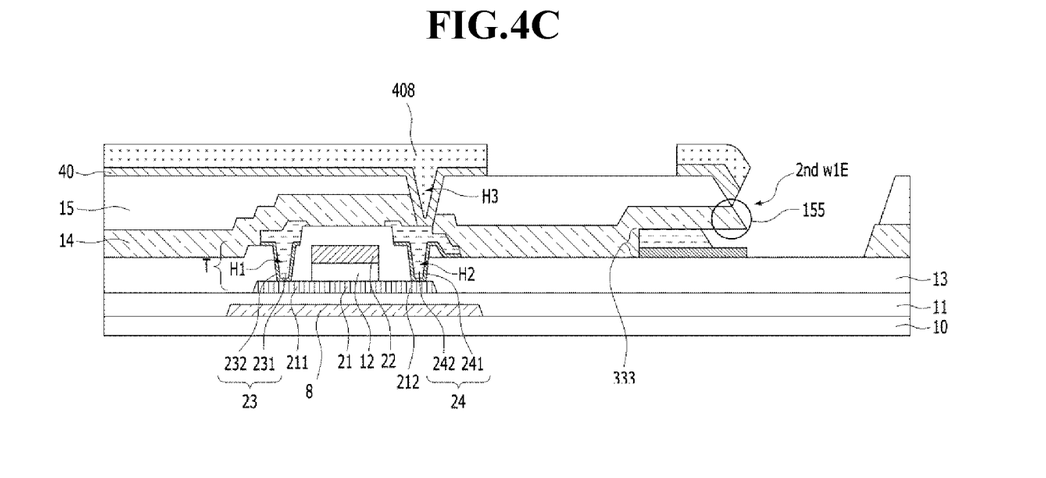

Subsequently, as shown in FIG. 4C, an anode metal layer is stacked and patterned by photolithography and etching to form a first electrode 40 and a dummy electrode 45. At this time, a photoresist 408 on the first electrode 40 and the dummy electrode 45 used for photolithography is not removed, but remains.

Subsequently, the auxiliary electrode metal layer 333 under the passivation layer 14 is selectively etched by wet etching (first W/E). At this time, etching is controlled such that the auxiliary electrode metal layer 333 has a taper shape. As a result, as shown in FIG. 4D, the lower part of the passivation layer 14 has an undercut shape, and a second layer 312 of an auxiliary electrode 31 is located only inside the passivation layer 14 so as to have a taper shape.

Subsequently, the end of the passivation layer 14 that is exposed outside the planarization film 15 is selectively etched by wet etching. At this time, etching is controlled such that the end of the passivation layer 14 has a reverse taper shape.

Figure 4D:
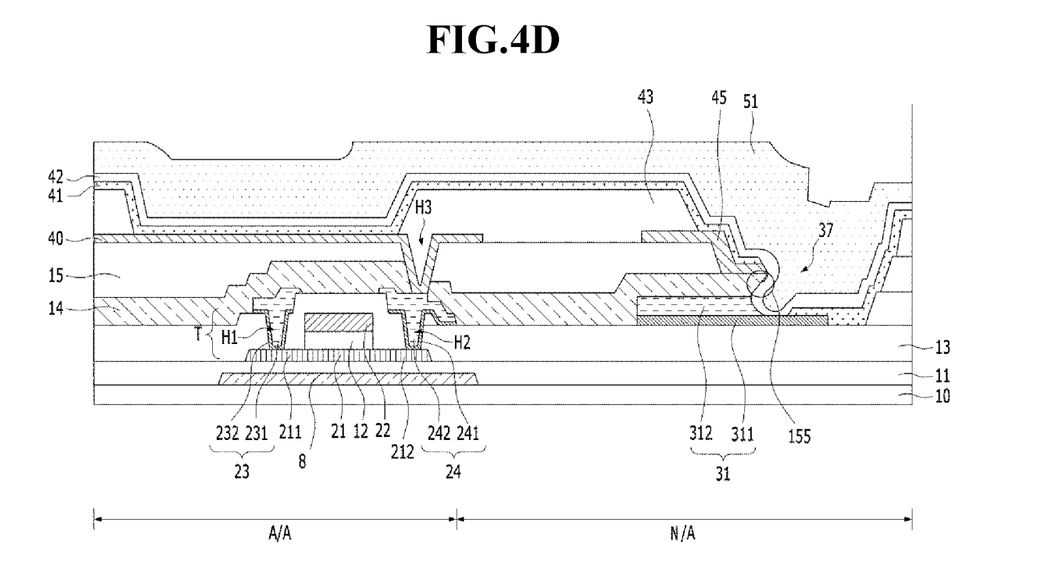

As a result, as shown in FIG. 4D, the end of the passivation layer 14 has a reverse taper shape, and the second layer 312 of an auxiliary electrode 31 located under the passivation layer 14 is formed so as to have a taper shape. A first layer 311 of an auxiliary electrode 31 is not etched and thus extends outside the second layer 312.

Meanwhile, depending on the design, the auxiliary electrode metal layer 333 and the passivation layer 14 may be formed, the auxiliary electrode metal layer 333 may be selectively etched to form the auxiliary electrode, the planarization film 15, the first electrode 40, and the dummy electrode 45 may be formed, and an end 155 of the passivation layer 14 may be formed so as to have a reverse taper shape using the remaining photoresist 408.

After the end 155 of the passivation layer 14 is formed, the remaining photoresist is removed.

Subsequently, a bank insulation film 43 is formed to define a pixel region. The bank insulation film 43 may include polyimide or acryl.

Subsequently, an organic layer 41 including an emissive layer and a second electrode are sequentially deposited on the bank insulation film 43 and the first electrode 40. The organic layer 41 may be formed so as to include a hole injection layer (HIL), a hole transport layer (HTL), an emissive layer (EML), an electron transport layer (ETL), and an electron injection layer (EIL).

The second electrode 42 is formed on the entirety of one surface of the substrate 10. The second electrode 42 may be made of a transparent conductive material, such as ITO, IZO, IGZO, or ZnO. Alternatively, the second electrode 42 may be made of any one selected from among silver (Ag), titanium (Ti), aluminum (Al), and molybdenum (Mo) or an alloy thereof. As previously described, the second electrode 42 may contact the first layer 311 of the auxiliary electrode 31 under the end 155 of the passivation layer 14. Alternatively, the second electrode 42 may contact the first layer 311 of the auxiliary electrode 31, and may also contact the side surface of the second layer 312 of the auxiliary electrode 31.

Subsequently, a sealing layer 51 is formed on the entire surface of the substrate 10. The sealing layer 51 may have a single-layer structure made of SiOx or SiNx. Alternatively, the sealing layer 51 may have a multi-layer structure in which SiOx and SiNx are alternately stacked.

As is apparent from the above description, in the organic light-emitting display device according to the present disclosure, the auxiliary electrode is located under the reverse taper-shaped end of the passivation layer, and is connected to the second electrode. In the organic light-emitting display device according to the present disclosure including the reverse taper-shaped passivation layer, the sealing layer can fill the space under the passivation layer, with the result that no gap is formed. Consequently, the light-emitting display device is prevented from being defective, and the mechanical properties of the organic light-emitting display device are also improved.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting display device comprising:
   a substrate having an active area and a non-active area;
   a first electrode located on the substrate on the active area;
   a bank insulation film located partially on the first electrode;
   an organic layer located on the first electrode and the bank insulation film;
   a second electrode located on the organic layer and the bank insulation film;
   an auxiliary electrode located on the substrate on the non-active area, the auxiliary electrode having a lower surface on the substrate and an upper surface above its lower surface, wherein the lower surface of the auxiliary electrode extends a first distance over the substrate and the upper surface of the auxiliary electrode extends a second, shorter distance over the substrate that is less than its lower surface; and
   a passivation layer located on the auxiliary electrode and below the bank insulation film, the passivation layer having a lower surface on the auxiliary electrode and an upper surface above its lower surface, wherein the lower surface of the passivation layer extends a first distance over the auxiliary electrode and the upper surface extends a second, greater distance over the auxiliary electrode and over its lower surface, an interface between the passivation layer and the auxiliary electrode being recessed further inward than the upper surface of the passivation layer and the lower surface of the auxiliary electrode; and wherein
   the second electrode is electrically connected to the auxiliary electrode.

2. The organic light-emitting display device according to claim 1, wherein the second electrode extends to the non-active area so as to be electrically connected to the auxiliary electrode.

3. The organic light-emitting display device according to claim 1, further comprising:
   a planarization film located on the passivation layer so as to expose the a side surface of the passivation layer; and
   a dummy electrode provided above the planarization film and laying on the side surface of the passivation layer.

4. The organic light-emitting display device according to claim 3, wherein
   the first electrode is located on the planarization film, and
   the first electrode and the dummy electrode are located on a same layer and are made of a same material.

5. The organic light-emitting display device according to claim 4, further comprising:
   a thin film transistor located on the substrate, wherein
   the passivation layer and the planarization film are provided on the thin film transistor,
   the first electrode is connected to the thin film transistor via a contact hole formed by removing a portion of the planarization film and the passivation layer to expose any one selected from between a source electrode and a drain electrode of the thin film transistor, and
   the auxiliary electrode is located on a same layer as the source electrode and the drain electrode of the thin film transistor and is made of a same material as the source electrode and the drain electrode of the thin film transistor.

6. The organic light-emitting display device according to claim 5, wherein the auxiliary electrode is formed so as to have the recessed inward end from the lower surface of the auxiliary electrode by sequentially forming a metal layer and the passivation layer on the substrate and selectively etching the metal layer through a first wet etching process.

7. The organic light-emitting display device according to claim 6, wherein the passivation layer is formed so as to have the recessed inward from the upper surface of the passivation layer by sequentially forming the at least one planarization film and the dummy electrode on the passivation layer, after the auxiliary electrode is formed, and selectively etching the passivation layer through a second wet etching process.

8. The organic light-emitting display device according to claim 5, wherein
   the auxiliary electrode is formed so as to have a recessed inward shape from its lower surface only in a portion of a region under the passivation layer by sequentially forming a metal layer, the passivation layer, the planarization film, and the dummy electrode on the substrate and selectively etching the metal layer through a first wet etching process, and
   the passivation layer is formed so as to have the recessed inward shaped end from its upper surface by selectively etching the passivation layer through a second wet etching process after the auxiliary electrode is formed.

9. The organic light-emitting display device according to claim 7, wherein the first wet etching process and the second wet etching process are performed using a photoresist remaining on the dummy electrode after the dummy electrode is formed.

10. The organic light-emitting display device according to claim 1, wherein
    the auxiliary electrode comprises a plurality of layers,
    a first layer of the auxiliary electrode is made of any one selected from between ITO and MoTi, and
    a second layer of the auxiliary electrode is made of Cu.

11. The organic light-emitting display device according to claim 10, wherein the first layer of the auxiliary electrode extends longer than an end of the passivation layer so as to be directly connected to the second electrode.

12. The organic light-emitting display device according to claim 1 wherein the auxiliary electrode is a top layer of a multilayer electrode.

13. The organic light-emitting display device according to claim 1 further including:
    a first auxiliary electrode layer positioned between the lower surface of the auxiliary electrode and the substrate.

14. The organic light-emitting display device according to claim 13 wherein the lower surface of the auxiliary electrode extends outward at an interface with the first auxiliary electrode layer.

* * * * *